US007999531B2

(12) United States Patent
Ichiyama

(10) Patent No.: US 7,999,531 B2
(45) Date of Patent: Aug. 16, 2011

(54) PHASE DETECTING APPARATUS, TEST APPARATUS AND ADJUSTING METHOD

(75) Inventor: Kiyotaka Ichiyama, Saitama (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/753,796

(22) Filed: Apr. 2, 2010

(65) Prior Publication Data
US 2010/0321001 A1    Dec. 23, 2010

Related U.S. Application Data

(63) Continuation of application No. PCT/JP2009/002843, filed on Jun. 22, 2009.

(51) Int. Cl.
*G01R 23/12* (2006.01)
(52) U.S. Cl. .................................. 324/76.52; 324/76.77
(58) Field of Classification Search ................ 324/76.52
See application file for complete search history.

(56) References Cited

U.S. PATENT DOCUMENTS

| 7,304,510 | B2 * | 12/2007 | Matsuta ............................. 327/3 |
| 7,855,607 | B2 * | 12/2010 | Shimamoto ...................... 331/57 |
| 2003/0006750 | A1 | 1/2003 | Roberts et al. |
| 2007/0085570 | A1 | 4/2007 | Matsuta |
| 2009/0048796 | A1 | 2/2009 | Yamamoto et al. |
| 2009/0216488 | A1 | 8/2009 | Baba et al. |

FOREIGN PATENT DOCUMENTS

| JP | 2001-108725 A | 4/2001 |
| JP | 2004-61339 A | 2/2004 |
| JP | 2004-239666 A | 8/2004 |
| JP | 2005-521059 A | 7/2005 |

(Continued)

OTHER PUBLICATIONS

International Search Report (ISR) issued in PCT/JP2009/002843 (parent application) mailed in Oct. 2009 for Examiner consideration, citing U.S. Patent Application Publication Nos. US2007/85570, US2009/48796, US2003/6750, and Foreign Patent document Nos. JP2007-110370, WO2009/022691, JP2005-521059, WO2006/041162, WO2008/108374, JP2001-108725, and JP2004-61339 which have been submitted with Japanese ISR in a previous IDS.

(Continued)

*Primary Examiner* — Thomas Valone
(74) *Attorney, Agent, or Firm* — Chen Yoshimura LLP

(57) ABSTRACT

Provided is a phase detecting apparatus that detects a phase difference between signals, comprising a phase comparing section that sequentially delays a second input signal relative to a first input signal, according to a set value, and that compares a phase of the second input signal to a phase of the first input signal each time a relative phase between the input signals changes; and a delay adjusting section that adjusts in advance a delay amount of a signal in the phase comparing section. The delay adjusting section includes a signal generating section that generates a first adjustment signal and a second adjustment signal, which has a period that is shorter than a period of the first adjustment signal by an amount corresponding to the set value, and inputs the first adjustment signal and the second adjustment signal to the phase comparing section as the first input signal and the second input signal, respectively; and an adjusting section that adjusts a delay amount of the phase in the phase comparing section based on the phase comparison result by the phase comparing section between the first adjustment signal and the second adjustment signal.

12 Claims, 7 Drawing Sheets

FOREIGN PATENT DOCUMENTS

| | | |
|---|---|---|
| JP | 2006/041162 A1 | 4/2006 |
| JP | 2007-110370 A | 4/2007 |
| WO | 2008/108374 A1 | 9/2008 |
| WO | 2009/022691 A1 | 2/2009 |

OTHER PUBLICATIONS

International Search Report (ISR) for PCT/JP2009/002843 (parent application) for Examiner consideration. Concise Explanation of Relevance: This ISR cites U.S. Patent Application Publication Nos. 1-3 and Foreign Patent Document Nos. 1-7 listed above as category A: "document defining the general state of the art which is not considered to be of particular relevance."

Written Opinion (PCT/ISA/237) issued in PCT/JP2009/002843 (parent application). Concise Explanation of Relevance: This Written Opinion considers the claims are not described by or obvious over the references Nos. 1-7 cited in ISR.

* cited by examiner

PHASE DETECTING APPARATUS, TEST APPARATUS AND ADJUSTING METHOD

BACKGROUND

1. Technical Field

The present invention relates to a phase detecting apparatus, a test apparatus, and an adjusting method.

2. Related Art

A known circuit for detecting a phase difference between two signals is a circuit that sequentially delays at least one of the signals and, each time a signal is delayed, compares the edge timings of the two signals. In order to accurately output the phase difference, it is desirable for the delay amounts of the signals to be accurately adjusted. Related prior art is shown by the patent document below.

Patent Document 1: Japanese Patent Application Publication No. 2004-239666

The delay amount of a signal can be measured from an oscillation period of the signal looped in a loop that includes a delay path, for example. Here, the delay amount in the delay path can be adjusted.

However, there is variation in the characteristics of the comparison circuit that compares the edge timings of the signals. Performing a calibration by measuring the delay amount in the delay path does not decrease the variation in the comparison circuit, and so such a calibration does not enable accurate detection of the phase difference between the signals. Therefore, a technique is desired for efficiently performing a calibration that includes the characteristics of the comparison circuit.

SUMMARY

Therefore, it is an object of an aspect of the innovations herein to provide a phase detecting apparatus, a test apparatus, and an adjusting method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary phase detecting apparatus may include a phase detecting apparatus that detects a phase difference between signals, comprising a phase comparing section that sequentially delays a second input signal relative to a first input signal, according to a set value, and that compares a phase of the second input signal to a phase of the first input signal each time a relative phase between the input signals changes; and a delay adjusting section that adjusts in advance a delay amount of a signal in the phase comparing section. The delay adjusting section includes a signal generating section that generates a first adjustment signal and a second adjustment signal, which has a period that is shorter than a period of the first adjustment signal by an amount corresponding to the set value, and inputs the first adjustment signal and the second adjustment signal to the phase comparing section as the first input signal and the second input signal, respectively; and an adjusting section that adjusts a delay amount of the phase in the phase comparing section based on the phase comparison result by the phase comparing section between the first adjustment signal and the second adjustment signal. Also provided is an adjusting method that emplys the phase detecting apparatus.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
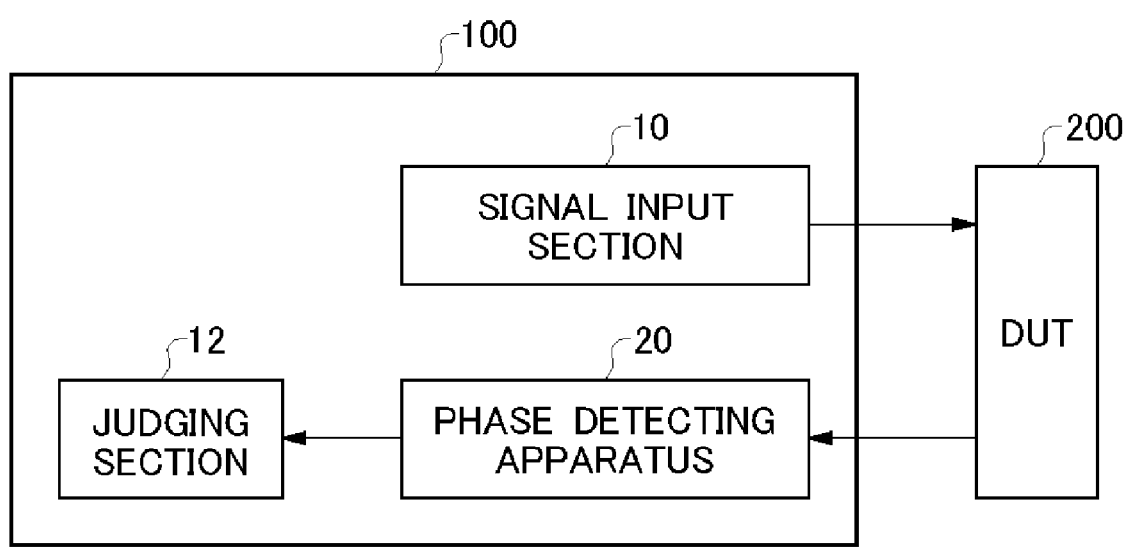
FIG. 1 shows a configuration of a test apparatus 100 according to an embodiment of the present invention, along with a device under test 200.

FIG. 1 shows a configuration of a test apparatus 100 according to an embodiment of the present invention, along with a device under test 200. The test apparatus 100 tests the device under test 200, which may be a semiconductor circuit, and includes a signal input section 10, a phase detecting apparatus 20, and a judging section 12.

The signal input section 10 supplies a test signal to the device under test 200. For example, the signal input section 10 may generate a test signal that has a waveform or a logic pattern corresponding to a test program supplied by a user. The signal input section 10 may generate a test signal having a predetermined relative phase with respect to a rate signal serving as a reference for the test cycle.

The phase detecting apparatus 20 detects a phase difference between a signal output by the device under test 200 and a predetermined reference signal. The phase detecting apparatus 20 may detect the phase difference between the signal output by the device under test 200 and the rate signal described above.

The judging section 12 judges acceptability of the device under test 200 based on the detection result of the phase difference by the phase detecting apparatus 20. For example, the judging section 12 may judge the acceptability of the device under test 200 based on whether the phase difference detected by the phase detecting apparatus 20 is within a predetermined phase difference range.

Figure 2:
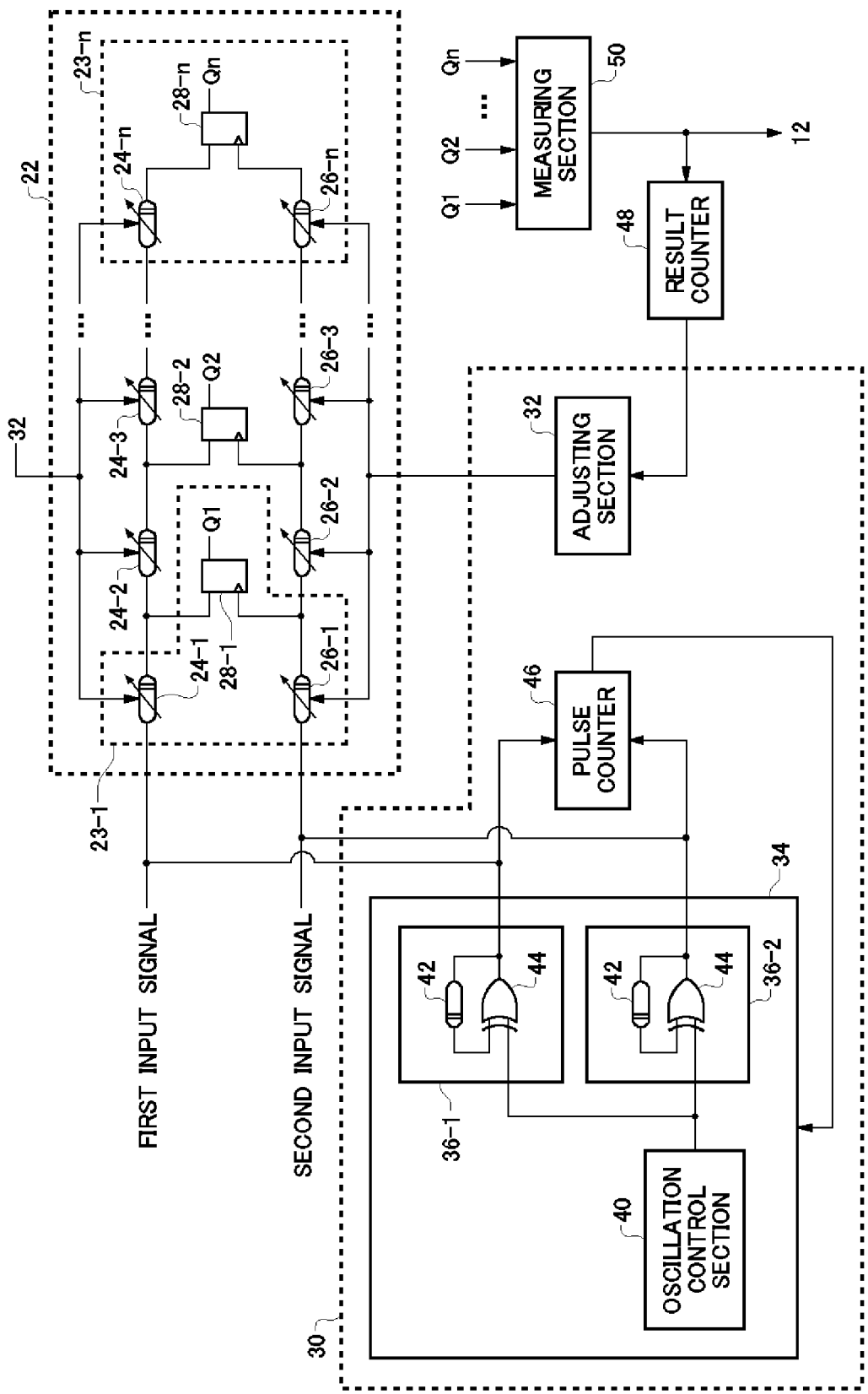
FIG. 2 shows an exemplary configuration of the phase detecting apparatus 20.

FIG. 2 shows an exemplary configuration of the phase detecting apparatus 20. The phase detecting apparatus 20 detects the phase difference between a first input signal and a second input signal provided thereto. In the present embodiment, the first input signal is the signal output by the device under test 200 and the second input signal is the reference signal, i.e. the rate signal.

The phase detecting apparatus 20 includes a phase comparing section 22, a measuring section 50, a result counter 48, and a delay adjusting section 30. The phase comparing section 22 sequentially delays the second input signal relative to the first input signal, according to a set value, and compares the phase of the second input signal to the phase of the first input signal each time the relative phase between the input signals changes. The phase comparing section 22 of the present embodiment includes n sampling circuits 23 connected in cascade for sequentially delaying the phase of the second input signal by a prescribed value relative to the first input signal, and sampling the delayed signal. Here, n is an integer.

Each sampling circuit 23 includes a first transmitting section 24, a second transmitting section 26, and a sampling section 28. Each first transmitting section 24 sequentially transmits the received first input signal to the first transmitting section 24 in a sampling circuit 23 at a later stage. The first transmitting sections 24 may be variable delay circuits. The delay amount of the first transmitting section 24 in each sampling circuit 23 may be set to a constant value T.

Each second transmitting section 26 delays the second input signal input thereto by a delay amount that is greater than the delay amount of the first transmitting section 24 by a value corresponding to a predetermined set value, and sequentially transmits the delayed signal to the second transmitting section 26 in a sampling circuit 23 at a later stage. The second transmitting sections 26 may be variable delay circuits. The delay amount of the second transmitting section 26 in each sampling circuit 23 may be equal to the sum of the constant value T and $\Delta\tau$. With this configuration, the second input signal is delayed by $\Delta\tau$ relative to the first input signal each time the second input signal passes through a sampling circuit 23.

Each sampling section 28 samples one of the first input signal transmitted by the first transmitting section 24 and the second input signal transmitted by the second transmitting section 26, using the other of the input signals. The sampling sections 28 of the present embodiment are flip-flops that each acquire and output a value of the first input signal at the edge timing of the second input signal.

The measuring section 50 receives the sampling results from the sampling sections 28 and detects the phase difference between the first input signal and the second input signal based on these sampling results. As described above, the second input signal is delayed by $\Delta\tau$ relative to the first input signal each time the second input signal passes through a sampling circuit 23. Therefore, the phase difference can be detected as the product of the set value $\Delta\tau$ and the number of sampling circuits 23 at which the logic value output from the sampling section 28 transitions.

The measuring section 50 supplies the judging section 12 with the detected phase difference between the signals. The judging section 12 judges the acceptability of the device under test 200 based on this phase difference between the signals.

The delay adjusting section 30 adjusts in advance the delay amounts of the first transmitting section 24 and the second transmitting section 26 in the phase comparing section 22 by a delay amount corresponding to the set value $\Delta\tau$ supplied thereto. The delay adjusting section 30 may adjust at least one of the first transmitting section 24 and the second transmitting section 26 such that the delay difference between the first transmitting section 24 and the second transmitting section 26 corresponds to the set value $\Delta\tau$.

The delay adjusting section 30 includes a signal generating section 34, a pulse counter 46, and an adjusting section 32.

The signal generating section 34 generates a first adjustment signal and a second adjustment signal whose period is smaller than that of the first adjustment signal by an amount corresponding to the predetermined set value $\Delta\tau$. The delay adjusting section 30 of the present embodiment includes a first oscillator 36-1, a second oscillator 36-2, and an oscillation control section 40.

The first oscillator 36-1 generates the first adjustment signal and inputs the first adjustment signal to the phase comparing section 22 as the first input signal. The first oscillator 36-1 may generate a first adjustment signal whose period is substantially equal to the sum of the delay amount T of the second transmitting section 26 and $\Delta\tau$.

The second oscillator 36-2 generates the second adjustment signal and inputs the second adjustment signal to the phase comparing section 22 as the second input signal. The second oscillator 36-2 may generate a second adjustment signal whose period is substantially equal to the delay amount T of the first transmitting section 24 and $\Delta\tau$. In other words, the signal generating section 34 generates the second adjustment signal to have a period that is smaller than that of the first adjustment signal by an amount substantially equal to the predetermined constant value $\Delta\tau$.

The oscillation control section 40 causes oscillation of the first oscillator 36-1 and the second oscillator 36-2 to begin in synchronization. The first oscillator 36-1 and the second oscillator 36-2 are loop oscillators that each include a delay element 42 and a logic circuit 44 in a loop connection, and the oscillation control section 40 may input a trigger pulse at the same timing to both of the oscillators 36. The delay amount of the delay element 42 in the first oscillator 36-1 may be equal to the delay amount to be set for the second transmitting section 26. The delay amount of the delay element 42 in the second oscillator 36-2 may be equal to the delay amount to be set for the first transmitting section 24.

The pulse counter 46 counts the number of pulses output by the first oscillator 36-1 and the second oscillator 36-2. The count value of the pulse counter 46 is desirably reset to an initial value every time that the oscillation control section 40 initiates oscillation of the first oscillator 36-1 and the second oscillator 36-2.

With this configuration, the k-th pulse of the first adjustment signal is delayed by $k \times \Delta\tau$ relative to the k-th pulse of the second adjustment signal, where k=1, 2, ..., n. Furthermore, in the k-th stage sampling circuit 23, the second input signal is delayed by $k \times \Delta\tau$ relative to the first input signal.

Therefore, in the k-th stage sampling circuit 23, the phases of the k-th pulses of the first adjustment signal and the second adjustment signal are substantially the same. In other words, when the sampling section 28 of the k-th stage sampling circuit 23 repeatedly measures the logic values Qk output for the k-th pulses of the first adjustment signal and the second adjustment signal, the ratio of logic values Qk that are H (1) to logic values Qk that are L(0) is one to one.

The result counter 48 counts that number of H logic values and the number of L logic values output by the k-th stage sampling section 28 for the logic values Qk output for the k-th pulses of the first adjustment signal and the second adjustment signal. The adjusting section 32 adjusts the phase delay amount of each sampling circuit 23 based on the phase comparison results of the phase comparing section 22 between the first adjustment signal and the second adjustment signal. The adjusting section 32 of the present embodiment controls the delay amounts of the first transmitting section 24 and the second transmitting section 26 in each sampling circuit 23 according to the count results in the result counter 48.

For each k-th stage sampling circuit 23, the adjusting section 32 adjusts the delay amount difference Δτ based on the sampling result obtained for the k-th pulses of the first adjustment signal and the second adjustment signal. More specifically, for each sampling circuit 23, the adjusting section 32 controls the delay amounts of the first transmitting section 24 and the second transmitting section 26 such that the number of H logic values and the number of L logic values counted by the result counter 48 are substantially equal to each other.

At this time, the adjusting section 32 may adjust the delay amounts in order beginning with the first stage sampling circuit 23-1. With this configuration, the calibration of the delay amounts including the variation of the characteristics of the sampling section 28 can be efficiently performed.

Figure 3:
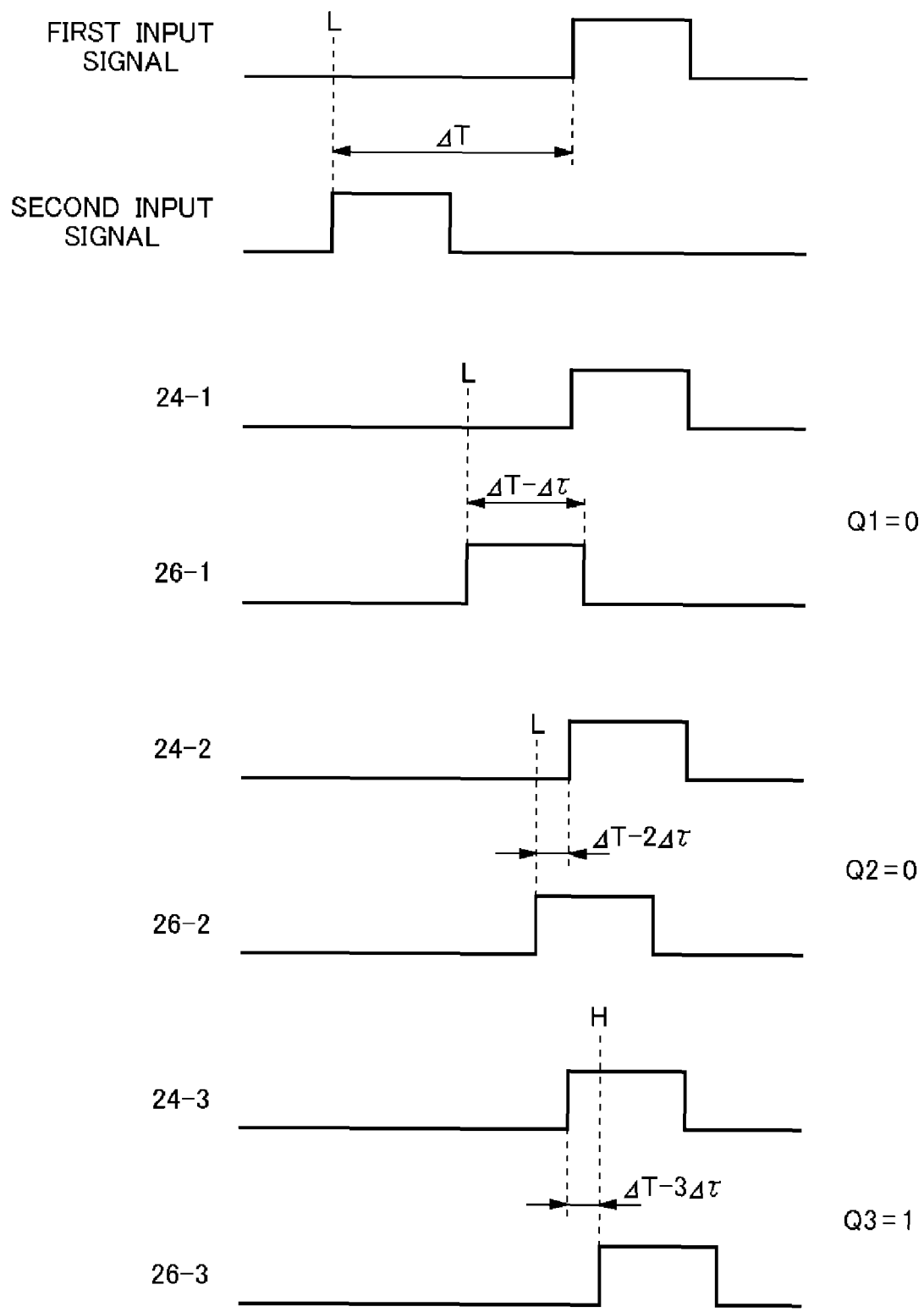
FIG. 3 is a timing chart showing an exemplary operation of the phase comparing section 22.

FIG. 3 is a timing chart showing an exemplary operation of the phase comparing section 22. The first input signal of the present embodiment has an initial phase that is delayed by ΔT relative to the second input signal. Here, the "initial phase" refers to the phase at the time of input to the phase comparing section 22. In the first stage sampling circuit 23-1, the second input signal is delayed by Δτ relative to the first input signal. Therefore, the phase difference between the first input signal and the second input signal input to the first stage sampling section 28-1 is ΔT−Δτ.

In the second-stage sampling circuit 23-2, the second input signal is further delayed by Δτ relative to the first input signal. Therefore, the phase difference between the first input signal and the second input signal input to the second stage sampling section 28-2 is ΔT−2×Δτ. In the same way, each time the second input signal is transmitted a sampling circuit 23 at a later stage, the second input signal is further delayed by Δτ relative to the first input signal.

Therefore, by detecting the number of stages at which the logic value output by the sampling section 28 has transitioned, the phase difference between the first input signal and the second input signal can be detected with a resolution of Δτ. In the present embodiment, the logic value of the sampling section 28 transitions at the second and third stages. Therefore, the difference between the initial phases of the first input signal and the second input signal is known to be between ΔT−2×Δτ and ΔT−3×Δτ.

Figure 4:
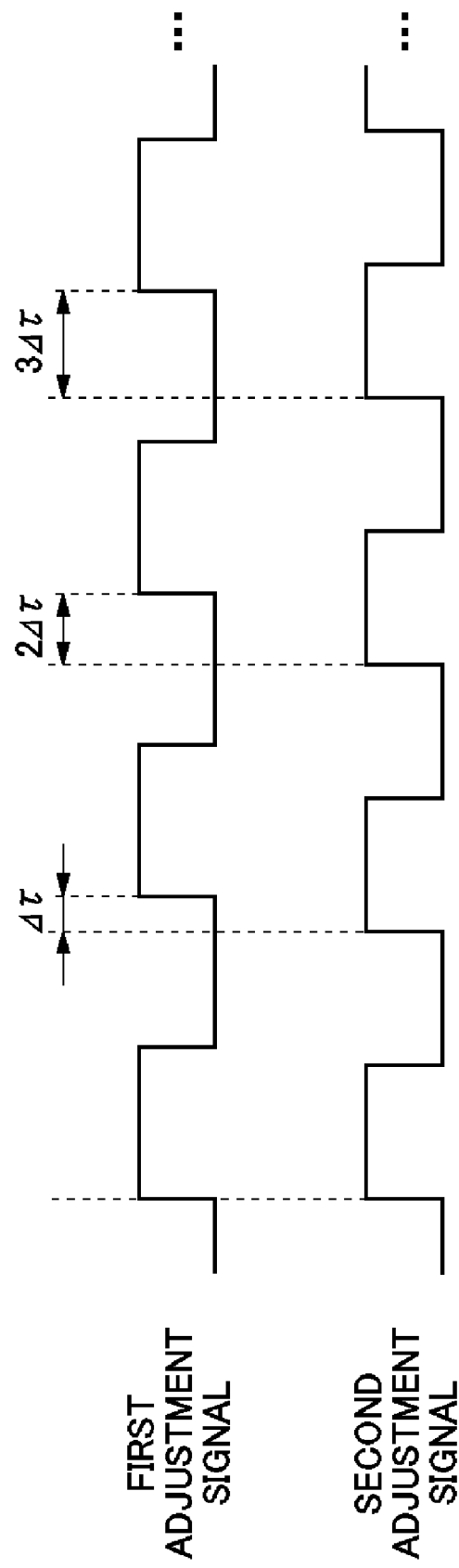
FIG. 4 is a timing chart showing an exemplary operation of the signal generating section 34.

FIG. 4 is a timing chart showing an exemplary operation of the signal generating section 34. As described above, the first oscillator 36-1 and the second oscillator 36-2 synchronously begin oscillating. The period of the first adjustment signal output by the first oscillator 36-1 is Δτ longer than the period of the second adjustment signal output by the second oscillator 36-2.

By inputting these adjustment signals to the phase comparing section 22, in the k-th stage sampling circuit 23, the phases of the k-th pulses of the first adjustment signal and the second adjustment signal become substantially the same, as described above. Therefore, the delay amount at each stage can be easily adjusted by adjusting the delay amount of each k-th stage sampling section 28 such that the number of H logic values and the number of L logic values output for the k-th pulses of the first adjustment signal and the second adjustment signal are substantially equal.

The adjusting section 32 may adjust the delay amount of at least one of the first transmitting section 24 and the second transmitting section 26 for each sampling section 28 such that the ratio of H logic values to L logic values output for the pulses of the first adjustment signal and the second adjustment signal becomes something other than 1 to 1. If the jitter of the adjustment signals is known, the adjusting section 32 may adjust the delay amount of at least one of the first transmitting section 24 and the second transmitting section 26 such that the ratio of H logic values to L logic values for the sampling section 28 becomes a value corresponding to the jitter.

Figure 5:
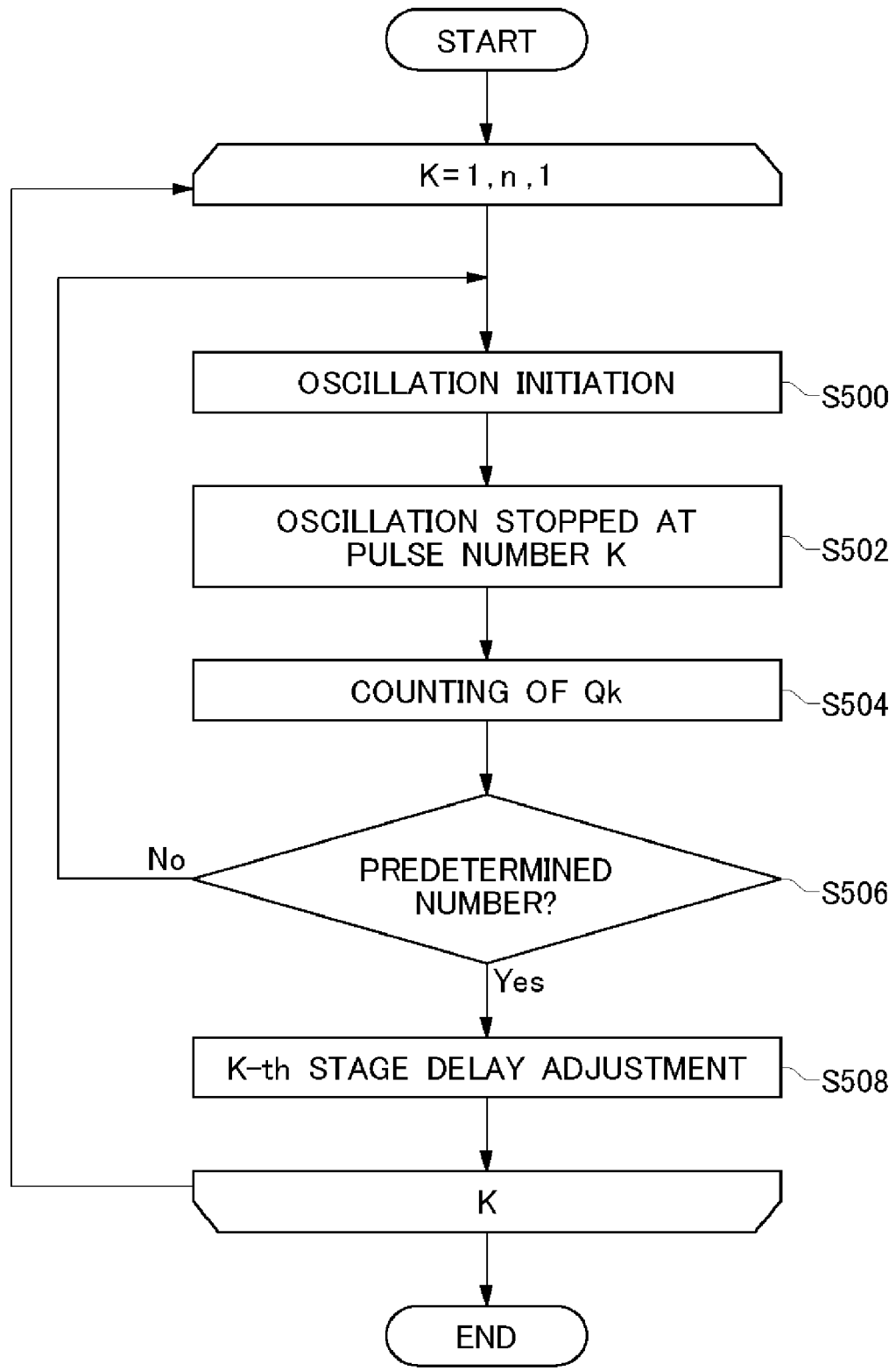
FIG. 5 is a flowchart describing an exemplary delay adjusting method performed by the delay adjusting section 30.

FIG. 5 is a flowchart describing an exemplary delay adjusting method performed by the delay adjusting section 30. The delay adjusting section 30 of the present embodiment stops the oscillation of the signal generating section 34 and begins a new oscillation each time one sampling circuit 23 acquires one logic value Qk.

In this exemplary operation of the delay adjusting section 30, the delay times of the first transmitting section 24-1 and the second transmitting section 26-1 in the first stage sampling circuit 23-1 are equal to each other, and the delay times of the second transmitting sections 26 in the second-stage sampling circuit 23 and onward are sequentially Δτ longer. In each of the sampling circuits 23, if the delay amount of the second transmitting section 26 is larger than that of the first transmitting section 24 by Δτ, the first pulses of each of the first adjustment signal and the second adjustment signal, which are pulses with the same phase, are not counted, and so the counting begins with the second pulses acting as the first pulses.

First, the delay amounts of the first transmitting section 24-1 and the second transmitting section 26-2 in the first stage sampling circuit 23-1 are adjusted (k=1). The oscillation control section 40 causes the first oscillator 36-1 and the second oscillator 36-2 to synchronously begin oscillating (S500). The pulse counter 46 counts the number of pulses output by the first oscillator 36-1 and the second oscillator 36-2.

When the pulse counter 46 has counted one pulse for each of the first oscillator 36-1 and the second oscillator 36-2, the oscillation control section 40 stops the oscillation of the first oscillator 36-1 and the second oscillator 36-2 (S502). The result counter 48 then increments the number of times an H logic value or the number of times an L logic value is counted for the first stage sampling section 28-1, based on the logic value Q1 output by the first stage sampling section 28-1 for the first pulses of the first adjustment signal and the second adjustment signal (S504).

Next, the adjusting section 32 judges whether the logic value Q1 has been measured a predetermined number of times (S506). If the number of measurements of the logic value Q1 is less than the predetermined value, the delay adjusting section 30 repeats the steps from S500. In other words, when adjusting the delay amount of a k-th stage sampling circuit 23-k, the oscillation control section 40 stops the oscillation of the first oscillator 36-1 and the second oscillator 36-2 when the count of the number of pulses of the first adjustment signal and the second adjustment signal reaches k, and repeats the process of beginning new simultaneous oscillation a predetermined number of times.

If the number of measurements of the logic value Q1 has reached the predetermined value, the adjusting section 32 adjusts the delay amounts of the first transmitting section 24-1 and the second transmitting section 26-2 such that the count result for the H logic values and L logic values match a predetermined result (S508). As described above, the adjusting section 32 may adjust the delay amounts of the first transmitting section 24-1 and the second transmitting section 26-2 such that the count values of the H logic values and L logic values for the first stage sampling section 28-1 are substantially equal to each other. If the delay amounts of the first transmitting section 24-1 and the second transmitting section 26-2 are changed, the steps from S500 may be performed again for the first stage sampling section 28-1.

When adjustment of the delay amount for the first stage sampling circuit 23-1 is complete, the steps from S500 are repeated for k=k+1. The process for each value of k is performed in the same way as described in the above case where k=1.

For example, in a case where k=m, when m pulses for each of the first oscillator 36-*m* and the second oscillator 36-*m* have been counted by the pulse counter 46 at step S502, the oscillation control section 40 stops the oscillation of the first oscillator 36-*m* and the second oscillator 36-*m*. The result counter 48 then increments the number of times an H logic value or the number of times an L logic value is counted for the m-th stage sampling section 28-*m*, based on the logic value Qm output by the m-th stage sampling section 28-*m* (S504). Other steps may be performed in the same manner as when k=1.

By performing the above process for the first stage sampling circuit 23-1 through the n-th stage sampling circuit 23-*n*, the delay amount difference $\Delta\tau$ can be adjusted for each sampling circuit 23. Furthermore, the delay amount of each sampling circuit 23 can be adjusted without changing the periods of the first adjustment signal and the second adjustment signal, and so the delay amounts of all of the sampling circuits 23 can be adjusted easily and accurately.

Figure 6:
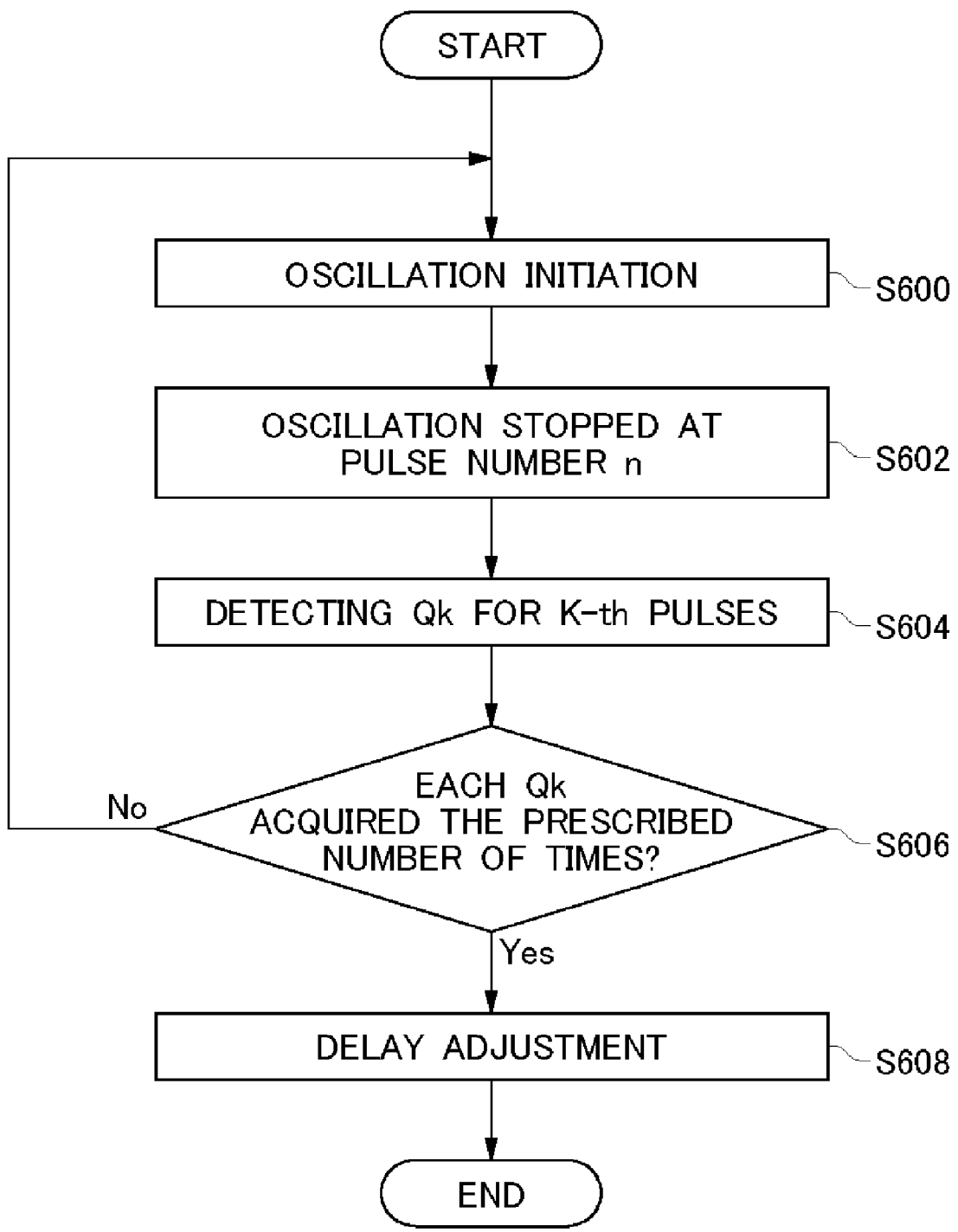
FIG. 6 is a flowchart describing another exemplary delay adjusting method performed by the delay adjusting section 30.

FIG. 6 is a flowchart describing another exemplary delay adjusting method performed by the delay adjusting section 30. The delay adjusting section 30 of the present embodiment acquires a logic value Qk from each sampling section 28 for each oscillation of the first oscillator 36-1 and the second oscillator 36-2.

The oscillation control section 40 causes the first oscillator 36-1 and the second oscillator 36-2 to synchronously begin oscillating (S600). The pulse counter 46 counts the number of pulses output by the first oscillator 36-1 and the second oscillator 36-2.

When the pulse counter 46 has counted n pulses for each of the first oscillator 36-1 and the second oscillator 36-2, the oscillation control section 40 stops the oscillation of the first oscillator 36-1 and the second oscillator 36-2 (S602). In other words, when the number of pulses counted by the pulse counter 46 for each oscillator becomes equal to the stage number of the sampling section 28, the oscillation control section 40 stops the oscillation of the first oscillator 36-1 and the second oscillator 36-2.

The result counter 48 then increments the number of times an H logic value or the number of times an L logic value is counted for the k-th stage sampling section 28-*k*, based on the logic value Qk output by the k-th stage sampling section 28-*k* (S604). The result counter 48 performs the process of S604 for all of the sampling sections 28 from k=1 to k=n.

Next, the adjusting section 32 determines, for each sampling section 28, whether the logic value Qk has been measured the predetermined number of times (S606). If the number of measurements of the logic value Qk is less than the predetermined value, the delay adjusting section 30 repeats the steps from S600. In other words, oscillation of the first oscillator 36-1 and the second oscillator 36-2 is stopped when the count results of the number of pulses of the first adjustment signal and the second adjustment signal both reach n, and the process of beginning new simultaneous oscillation is repeated a predetermined number of times.

When the number of measurements of the logic value Qk for each sampling circuit 23 has reached the predetermined number, the adjusting section 32 adjusts the delay amounts of the first transmitting section 24 and the second transmitting section 26 in each sampling circuit 23 such that the measurement results match predetermined results (S608). At this time, the adjusting section 32 may adjust the delay amounts in order beginning with the first stage sampling circuit 23-1.

When the delay amount of one of the sampling circuits 23 is changed, the delay adjusting section 30 may repeat the steps from S600 for all of the sampling circuits 23 at later stages than the sampling circuit 23 whose delay amount was changed. In the above process, the logic values Qk can be acquired for all of the sampling circuits 23 every time the first oscillator 36-1 and the second oscillator 36-2 oscillate once, and so the delay amounts can be adjusted more accurately.

Figure 7:
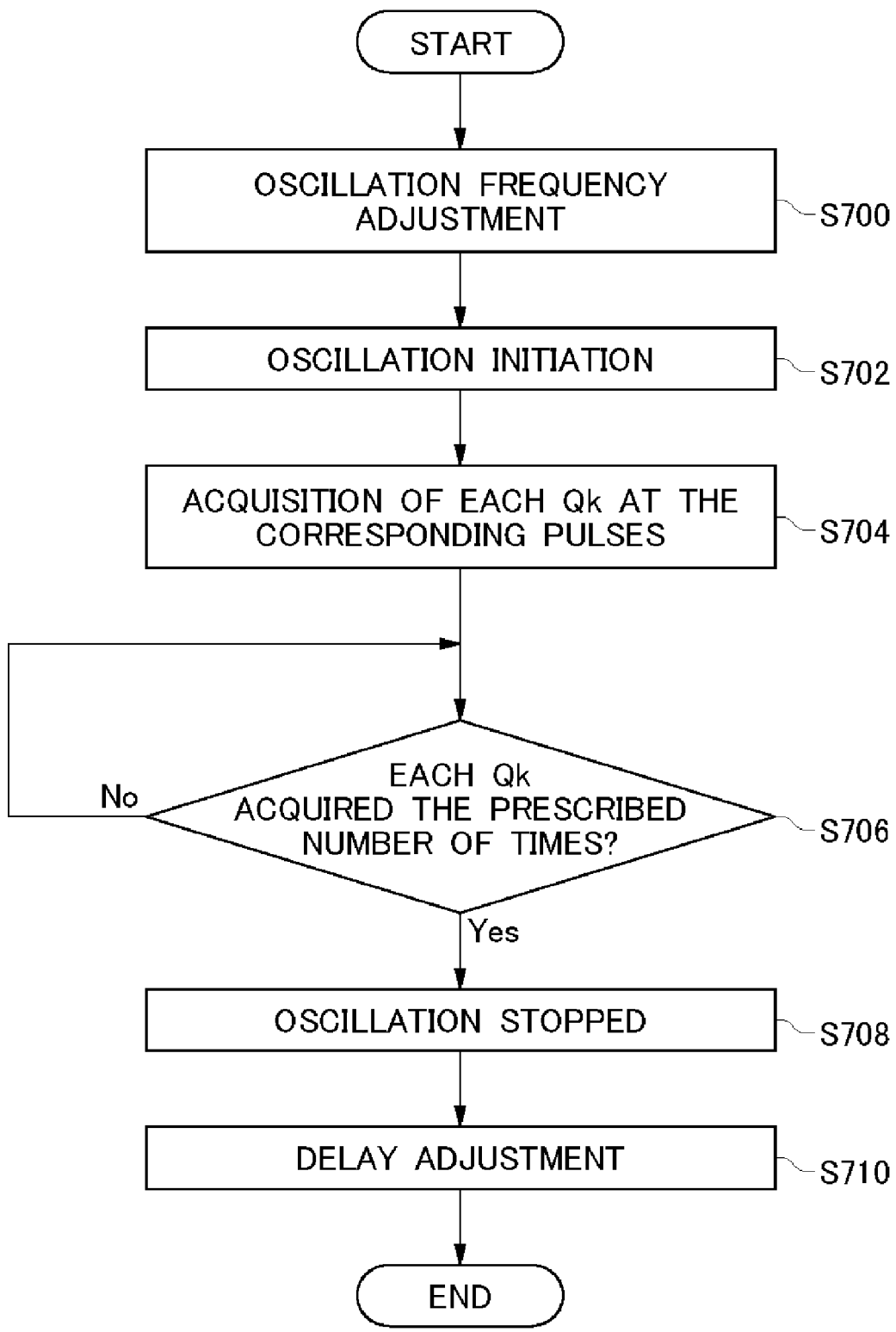
FIG. 7 is a flowchart describing another exemplary delay adjusting method performed by the delay adjusting section 30.

FIG. 7 is a flowchart describing another exemplary delay adjusting method performed by the delay adjusting section 30. The delay adjusting section 30 of the present embodiment acquires a logic value Qk output for the k-th pulse of the k-th stage sampling section 28 a predetermined number of times without starting or stopping oscillation of the first oscillator 36-1 and the second oscillator 36-2.

The oscillation control section 40 adjusts the delay amounts of the delay elements 42 in the first oscillator 36-1 and the second oscillator 36-2 such that the value $\Delta\tau \times n$, which is the product of the stage number n of the sampling circuit 23 and the period difference $\Delta\tau$ between the first adjustment signal and the second adjustment signal, becomes substantially equal to the sum of $\Delta\tau$ and the period T of the first adjustment signal (S700). As a result, the first adjustment signal and the second adjustment signal can be generated to have the same pulse timing in each of a plurality of predetermined time periods.

The oscillation control section 40 then causes the first oscillator 36-1 and the second oscillator 36-2 to synchronously begin oscillating (S702). For each of the above predetermined time periods, the result counter 48 acquires the logic value Qk output by the k-th stage sampling section 28-*k* for the k-th pulse within the time period (S704). In step S704, a process identical to that described in S604 of FIG. 6 may be performed for each of the predetermined time periods. The result counter 48 increments the number of times an H logic value or the number of times an L logic value is counted for each sampling section 28, based on the acquired logic values.

Next, the oscillation control section 40 judges, for each sampling section 28, whether the logic value Qk has been acquired the predetermined number of times (S706). The number of times that the logic value Qk is acquired can be obtained based on the count value of the pulse counter 46 by calculating how many cycles of the predetermined time period have passed.

When the logic value Qk has been acquired the predetermined number of times for each sampling section 28, the oscillation control section 40 stops the oscillation of the first oscillator 36-1 and the second oscillator 36-2 (S708). Then, the adjusting section 32 adjust the delay amounts of the first transmitting section 24 and the second transmitting section 26 in each sampling circuit 23 such that the measurement results acquired by the result counter 48 match the predetermined results (S710). At this time, the adjusting section 32 may adjust delay amounts in order beginning with the first-stage sampling circuit 23-1.

When the delay amount of one of the sampling circuits 23 is changed, the delay adjusting section 30 may repeat the steps from S700 for all of the sampling circuits 23 at later stages than the sampling circuit 23 whose delay amount was changed. In the above process, the logic values Qk can be acquired a predetermined number of times for all of the sampling circuits 23 every time the first oscillator 36-1 and the second oscillator 36-2 oscillate once, and so the delay amounts can be adjusted more accurately.

In the delay adjusting methods described in relation to FIGS. 2 to 7, the delay amount difference $\Delta\tau$ of each sampling circuit 23 is adjusted based on the period difference between the first adjustment signal and the second adjustment signal. Therefore, the period difference between the first adjustment signal and the second adjustment signal is desirably accurately adjusted in advance. The period difference between the first adjustment signal and the second adjustment signal can be calculated based on the difference in oscillation frequency between the first oscillator 36-1 and the second oscillator 36-2.

The oscillation control section 40 may use the pulse counter 46 described in relation to FIG. 2 to further function as a frequency measuring section that measures the oscillation frequency of the first oscillator 36-1 and the second oscillator 36-2. The oscillation control section 40 may calculate the oscillation frequency of the first oscillator 36-1 and the second oscillator 36-2 based on the number of pulses of the first adjustment signal and the second adjustment signal counted by the pulse counter 46 within the predetermined time period from the start of oscillation of the first oscillator 36-1 and the second oscillator 36-2.

The oscillation control section 40 may further function as an oscillation adjusting section that adjusts the oscillation frequency of the first oscillator 36-1 and the second oscillator 36-2 based on the measurement results. The oscillation control section 40 may adjust the oscillation frequency of the first oscillator 36-1 and the second oscillator 36-2 such that the period difference between the first adjustment signal and the second adjustment signal becomes equal to the delay amount difference Δτ to be set for the first transmitting section 24 and the second transmitting section 26.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A phase detecting apparatus that detects a phase difference between signals, comprising:
a phase comparing section that sequentially delays a second input signal relative to a first input signal, according to a set value, and that compares a phase of the second input signal to a phase of the first input signal each time a relative phase between the input signals changes; and
a delay adjusting section that adjusts in advance a delay amount of a signal in the phase comparing section, wherein the delay adjusting section includes:
a signal generating section that generates a first adjustment signal and a second adjustment signal, which has a period that is shorter than a period of the first adjustment signal by an amount corresponding to the set value, and inputs the first adjustment signal and the second adjustment signal to the phase comparing section as the first input signal and the second input signal, respectively; and
an adjusting section that adjusts a delay amount of the phase in the phase comparing section based on the phase comparison result by the phase comparing section between the first adjustment signal and the second adjustment signal.

2. The phase detecting apparatus according to claim 1, wherein
the phase comparing section sequentially delays the second input signal relative to the first input signal by a constant amount, and
the signal generating section generates the second adjustment signal to have a period that is shorter than the period of the first adjustment signal by an amount substantially equal to the constant value.

3. The phase detecting apparatus according to claim 2, wherein the signal generating section includes:
a first oscillator that generates the first adjustment signal;
a second oscillator that generates the second adjustment signal; and
an oscillation control section that causes the first oscillator and the second oscillator to synchronously begin oscillating.

4. The phase detecting apparatus according to claim 3, wherein
the phase comparing section includes n stages of sampling circuits connected in cascade, where n is an integer, the sampling circuits delaying the phase of the second input signal relative to the first input signal by a constant value and performing sampling, and
the adjusting section adjusts the delay amount of the phase of the second input signal relative to the first input signal in each k-th stage sampling circuit, where k=1, 2, ..., n, based on a sampling result using k-th pulses of the first adjustment signal and the second adjustment signal input to the phase comparing section.

5. The phase detecting apparatus according to claim 4, further comprising a counter that counts a number of pulses of the first adjustment signal and the second adjustment signal output by the first oscillator and the second oscillator, wherein
when the delay amount in the k-th stage sampling circuit is being adjusted, the oscillation control section stops the oscillation of the first oscillator and the second oscillator when the count results for the number of pulses for each of the first adjustment signal and the second adjustment signal reach k and repeats a process for synchronously initiating new oscillation a predetermined number of times, and
the adjusting section adjusts the delay amount in the k-th stage sampling circuit such that sampling results repeatedly acquired for the k-th pulses of the first adjustment signal and the second adjustment signal by the k-th stage sampling circuit become predetermined results.

6. The phase detecting apparatus according to claim 4, further comprising a counter that counts a number of pulses of the first adjustment signal and the second adjustment signal output by the first oscillator and the second oscillator, wherein
the oscillation control section stops the oscillation of the first oscillator and the second oscillator when the count results for the number of pulses for each of the first adjustment signal and the second adjustment signal reach n, and repeats a process for synchronously initiating new oscillation a predetermined number of times, and
the adjusting section adjusts the delay amount in the k-th stage sampling circuit such that sampling results repeatedly acquired for the k-th pulses of the first adjustment signal and the second adjustment signal by each sampling circuit become predetermined results.

7. The phase detecting apparatus according to claim 4, wherein the first oscillator and the second oscillator generate the first adjustment signal and the second adjustment signal such that a product of a stage number of the sampling circuit and a period difference between the first adjustment signal and the second adjustment signal becomes substantially equal to a period of the first adjustment signal, and synchronize the pulses of the first adjustment signal and the second adjustment signal for each of a plurality of predetermined time periods, and the adjusting section adjusts the delay amount in each k-th stage sampling circuit such that the sampling results of the k-th pulses of the first adjustment signal and the second adjustment signal acquired by the k-th stage sampling circuit in each of the predetermined time periods become predetermined results.

8. The phase detecting apparatus according to claim 5, wherein the adjusting section adjusts the delay amount in each sampling circuit such that a ratio of sampling results indicating an H logic value to sampling results indicating an L logic value becomes one to one in the sampling circuit.

9. The phase detecting apparatus according to claim 4, wherein each sampling circuit includes:
 a first transmitting section that transmits the first input signal input thereto to a sampling circuit at a later stage;
 a second transmitting section that transmits, with a delay amount relative to the first transmitting section that is equal to a value corresponding to the set value, a second input signal input thereto to a sampling circuit at a later stage; and
 a sampling section that samples one of the first input signal transmitted by the first transmitting section and the second input signal transmitted by the second transmitting section using the other of the first input signal and the second input signal, and the adjusting section adjusts the delay amount of at least one of the first transmitting section and the second transmitting section such that the sampling results of each sampling section become predetermined sampling results.

10. The phase detecting apparatus according to claim 3, further comprising:

a frequency measuring section that measures oscillation frequencies of the first oscillator and the second oscillator; and an adjusting section that adjusts the oscillation frequencies of the first oscillator and the second oscillator based on the measurement results of the frequency measuring section.

11. A test apparatus that tests a device under test, comprising:

the phase detecting apparatus according to claim 1 that detects a phase difference between a signal output by the device under test and a predetermined reference signal; and a judging section that judges acceptability of the device under test based on the detection result of the phase detecting apparatus.

12. An adjusting method for adjusting in advance a delay amount of a second input signal using a phase detecting apparatus that sequentially delays the second input signal relative to a first input signal, according to a set value, and that compares a phase of the second input signal to a phase of the first input signal each time a relative phase between the input signals changes, the adjusting method comprising:

generating a first adjustment signal and a second adjustment signal, which has a period that is shorter than a period of the first adjustment signal by an amount corresponding to the set value;

inputting the first adjustment signal and the second adjustment signal to the phase detecting apparatus as the first input signal and the second input signal, respectively; and adjusting a delay amount of the phase in the phase detecting apparatus based on sampling results by the phase detecting apparatus for the first adjustment signal and the second adjustment signal.

* * * * *